United States Patent [19]
Lee et al.

[11] Patent Number: 5,184,061
[45] Date of Patent: Feb. 2, 1993

[54] VOLTAGE REGULATOR FOR GENERATING A CONSTANT REFERENCE VOLTAGE WHICH DOES NOT CHANGE OVER TIME OR WITH CHANGE IN TEMPERATURE

[75] Inventors: Bang-Wan Lee, Kyungmung-city; Yl-Sung Bae, Seoul, both of Rep. of Korea

[73] Assignee: Samsung Electronics Co., Ltd., Suweon City, Rep. of Korea

[21] Appl. No.: 708,285

[22] Filed: May 30, 1991

[30] Foreign Application Priority Data

Mar. 27, 1991 [KR] Rep. of Korea .................... 91-4830

[51] Int. Cl.$^5$ ........................... G05F 1/46; G05F 1/567
[52] U.S. Cl. ...................................... 323/265; 323/313; 323/907; 257/300; 257/316
[58] Field of Search ............... 307/264, 320, 490; 323/234, 265, 280, 313, 907; 357/23.5; 341/122

[56] References Cited

U.S. PATENT DOCUMENTS

| | | | |
|---|---|---|---|
| 3,390,347 | 6/1968 | Jones et al. | 341/122 |
| 4,250,445 | 2/1981 | Brokaw | 323/313 |
| 4,849,684 | 7/1989 | Soantag et al. | 323/313 |
| 5,030,848 | 7/1991 | Wyatt | 323/313 |

FOREIGN PATENT DOCUMENTS 252927 12/1985 Japan ..................... 323/313

OTHER PUBLICATIONS

Lee et al, Hardware Annealing in Analog VLSI Neurocomputing, Kluwer Academic Publishers, 1991, pp. 104–112.

*Primary Examiner*—William H. Beha, Jr.
*Attorney, Agent, or Firm*—Cushman Darby & Cushman

[57] ABSTRACT

An improved voltage reference circuit is shown for use in analog integrated circuits including A/D and D/A converters. The voltage reference circuit comprises an operational amplifier having an non-inverting terminal connected to a capacitor. The inverting terminal of the op amp is connected to the op amp output terminal. The output terminal provides a constant reference voltage which is a function of the voltage charged in the capacitor. The capacitor includes a floating gate, an isolating layer, and a controlling gate which is used to charge (program) the capacitor to a fixed voltage. The capacitor structure is such that its charge is maintained constant over time independent of any temperature change. As a result, the voltage reference circuit prevents fluctuations in the output reference voltage throughout its operating period.

5 Claims, 2 Drawing Sheets

VOLTAGE REGULATOR FOR GENERATING A CONSTANT REFERENCE VOLTAGE WHICH DOES NOT CHANGE OVER TIME OR WITH CHANGE IN TEMPERATURE

BACKGROUND OF THE INVENTION

1. Field of the Invention

The present invention relates to a voltage reference circuit which is basically employed in an analog integrated circuit and is an indispensable circuit of an A/D converter or a D/A converter, more particularly to a voltage reference circuit employing a capacitor and an operational amplifier (OP AMP) for preventing deterioration of an output reference voltage due to the change of time and temperature upon integration thereof.

2. Description of the Prior Art

An arrangement of a conventional bandgap reference circuit is shown in FIG. 1. In the figure, a voltage reference circuit comprises a plurality of resistors $R_1$, $R_2$ and $R_3$, a plurality of transistors $Q_1$ and $Q_2$, $V_{OS}$, and an OP AMP.

The transistors $Q_1$ and $Q_2$ are substrate p-n-p transistors whose collectors are always tied to the most negative power supply. The OP AMP is a CMOS operational amplifier. FIG. 2A is a side view of the transistor shown in FIG. 1.

All resistors are $p^+$-diffusion registers in the $n^-$-well, and the CMOS operational amplifier is assumed to have an infinite gain with an offset voltage of $V_{OS}$. This assumption is justified because CMOS OP amps usually have enough gains such that the error due to finite-gain effects is negligible in this application. If we assume that transistor $Q_1$ has an area that is larger, by a factor A, than transistor $Q_2$, and both are in the forward active region, then output voltage $V_{REF}$ is given by, $$V_{REF} = V_{BE} + \left(1 + \frac{R_2}{R_1}\right)(\Delta V_{BE} + V_{OS}), \quad (1)$$

where $V_{BE}$ is an emitter-base voltage of the transistor $Q_1$, $\Delta V_{BE}$ is the difference between emitter-base voltages of the transistors $Q_1$ and $Q_2$, and $V_{OS}$ is the input offset voltage of the OP AMP.

The value of this expression is influenced by the nonideal properties of the bipolar transistors shown in FIG. 2B. The emitter-base voltage of the transistor $Q_1$ is given by, $$V_{BE} = V_T \ln \frac{I_1}{I_{s1}} + V_T \ln \frac{1}{1 + \frac{1}{\beta_1}} + \frac{\gamma b I_1}{A\beta_1}, \quad (2)$$

where $V_T$ is the thermal voltage $$\Delta V_{BE} = V_T \ln A + V_T \ln \frac{I_2}{I_1} + V_T \ln \frac{1 + \frac{1}{\beta_1}}{1 + \frac{1}{\beta_2}} + \quad (3)$$

$$\gamma b \left(\frac{I_2}{\beta_2} - \frac{I_1}{A\beta_1}\right),$$

$I_1$ is the emitter current of transistor $Q_1$, $I_{S1}$ is the saturation current of transistor $Q_1$, $\beta_1$ is a current gain of transistor $Q_1$ and $\gamma_b$ is the effective series base resistance of $Q_2$.

In Eq. 2, the second term results from the fact that while the collector current is a well-defined function of the emitter-base voltage, the current sensed and controlled by this circuit is the emitter current, and the third term results from the voltage drop in the finite series base resistance. The difference between the two emitter-base voltages is given by $$\frac{KT}{q},$$

where $I_2$ is the emitter current of transistor $Q_2$ and $\beta_2$ is the current gain of transistor $Q_2$.

If the bipolar transistor used to implement the reference are ideal in the sense that they have infinite current gain and zero base resistance, and if the emitter currents of the transistors are in fact equal than only the first terms in $E_{qs}$. 2 and 3 are nonzero.

However, because of the relatively poor performance of CMOS-compatible devices, these terms can strongly influence the performance of the reference.

The presence of the operational amplifier offset voltage in the output, multiplied by the gain factor $$\left(1 + \frac{R_2}{R_1}\right),$$

which is typically on the order of 10, is also an important degradation.

Also, the variation of the bias current $I_1$ and $I_2$ with temperature must be carefully considered. The offset of the OP AMP is the biggest error source that causes the nonreproducibility in the output voltage temperature coefficient.

A bandgap reference is trimmed to an output voltage which is predetermined to give a near-zero temperature coefficient of the output.

If we assume the offset voltage $V_{OS}$ is independent of temperature, the resulting temperature coefficient error due to a 5 mV $V_{OS}$, is expressed by the equation, $$TC \text{ error} = \frac{1 + \frac{R_2}{R_1}}{V_{REF}} \cdot \frac{\partial V_{OS}}{\partial T_O} \quad (4)$$

As mentioned above, when the input offset voltage changes in accordance with temperature, the reference output voltage $V_{REF}$ also changes in accordance with temperature, the reference, and the offset voltage of the circuit integrated by a MOS process is higher than that of the circuit integrated by a bipolar process, which exert a harmful influence upon the circuit.

On the other hand, in the conventional NMOS voltage reference circuit shown in FIG. 3, the transistors $Q_1$ and $Q_2$ are connected to two input terminals of the OP AMP. The transistor connected to the non-inverting terminal is a depletion type, and the transistor connected to the inverting terminal is an enhancement type. The reference voltage $V_{REF}$ is generated from a gate-source voltage difference of two N-channel MOSFETs.

The transistors are an enhancement device and a depletion device. The transistors also have the offset voltage regulated by the ion implantation, and two MOSFETs are biased under the saturation current condition.

At this time, as the major change of the reference voltage circuit is occured by the change of the offset voltage with respect to temperature. The reference voltage $V_{REF}$ is determined by threshold voltage of two transistors.

However, because it is difficult to correctly control the threshold voltage on integration, the problem which the reference voltage $V_{REF}$ can't be correctly controlled is occured.

SUMMARY OF THE INVENTION

The object of the present invention is, in view of the above-mentioned problem in the prior art, to provide a voltage reference circuit for employing a capacitor and an OP AMP for controlling the reference voltage correctly.

To achieve the above object, according to the present invention, voltage reference circuit comprises an operational amplifier including an inverting terminal, a non-inverting terminal, and an output terminal electrically connected to said inverting terminal; and a capacitor including a floating gate, a controlling gate, and a isolating layer, said capacitor connected to said non-inverting terminal of said operational amplifier and charging a required reference voltage.

According to the above constitution, the operational amplifier outputs the required reference voltage charged to said capacitor.

BRIEF DESCRIPTION OF THE DRAWINGS

The above object and feature of the present invention will be apparent from the following description of the preferred embodiment with reference to the accompanying drawings.

DESCRIPTION OF THE PREFERRED EMBODIMENTS

Figure 1:
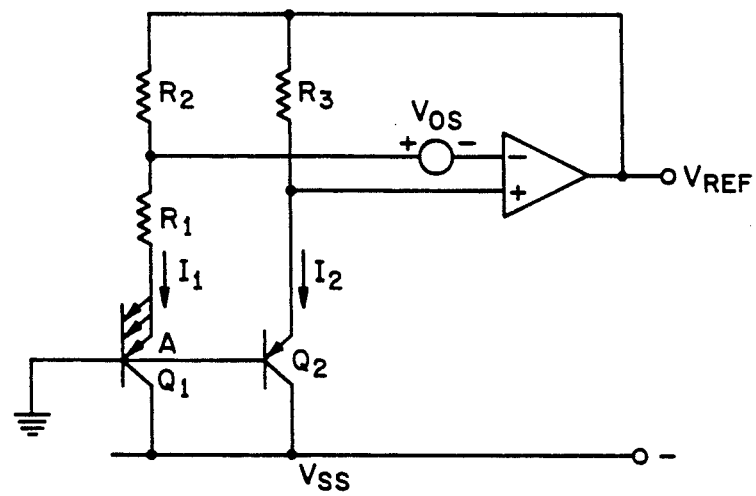
FIG. 1 is a circuit diagram showing a conventional bandgap reference circuit.
Figure 2A:
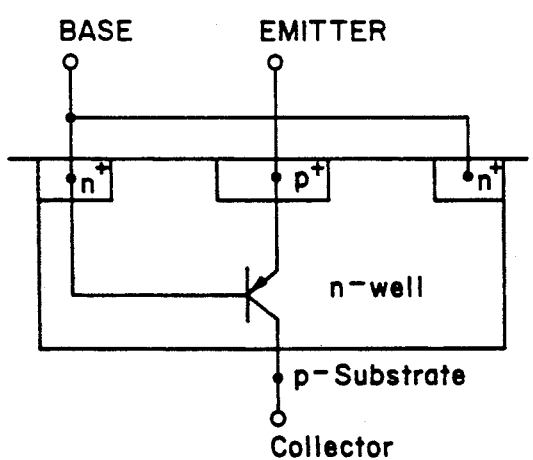
FIG. 2A is a side view showing a transistor of FIG. 1.
Figure 2B:
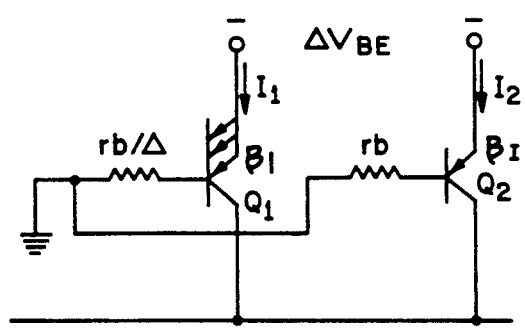
FIG. 2B is a circuit diagram showing nonideal parameter in the PTAT correction voltage generation circuit.
Figure 3:
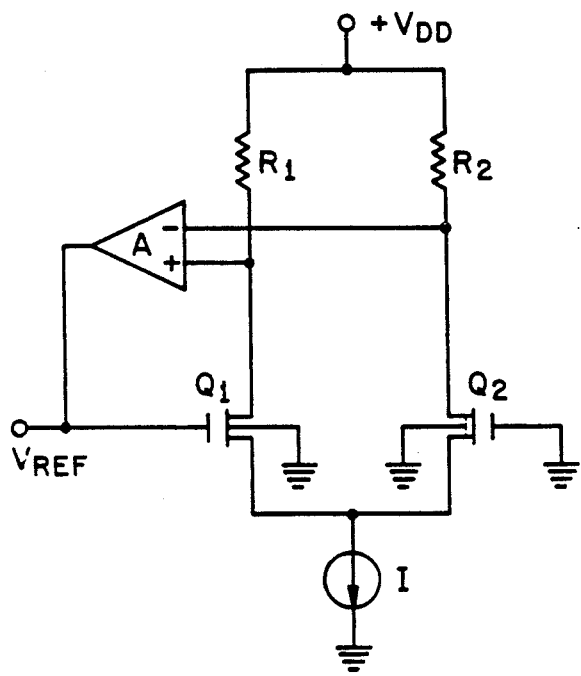
FIG. 3 is a circuit diagram showing a conventional NMOS voltage reference circuit.
Figure 4:
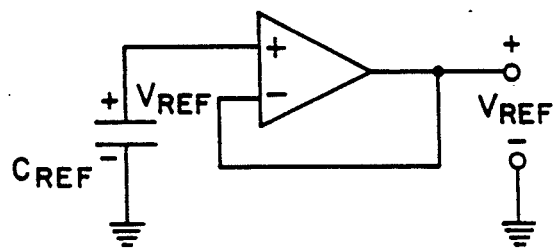
FIG. 4 is a circuit diagram showing a voltage reference circuit of the present invention.

FIG. 4 shows a voltage regulator circuit of the present invention. The voltage regulator circuit comprises an operational amplifier including an inverting terminal, a non-inverting terminal, and an output terminal electrically connected to the inverting terminal, and a capacitor including a floating gate, a controlling gate and an isolating layer. The capacitor is connected to the non-inverting terminal of the operational amplifier and stores a predetermined reference voltage charge. The operational amplifier outputs the reference voltage charged in the capacitor. The operational condition and function effect of the circuit will now be explained. In the circuit, when the voltage $V_{REF}$ to be required is charged in the capacitor, an electron charge mass Q is expressed by the equation, $$Q = C_{REF} \times V_{REF} \qquad (55)$$

where $C_{REF}$ is a capacitance of the capacitor.

If the charged capacitor is connected to the non-inverting terminal of the OP AMP and the output terminal of the OP AMP is electrically connected to the inverting terminal, then the charged voltage $V_{REF}$ is output at the output terminal of the OP AMP.

Figure 5A:
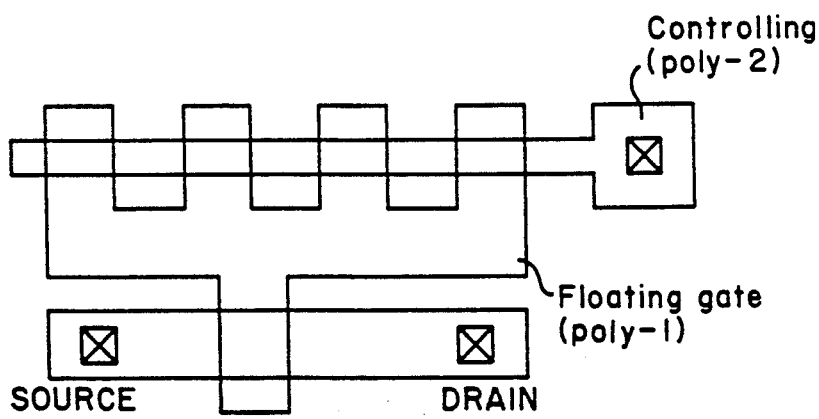
FIG. 5A is a plan view illustrating the embodiment of the circuit of FIG. 4.
Figure 5B:
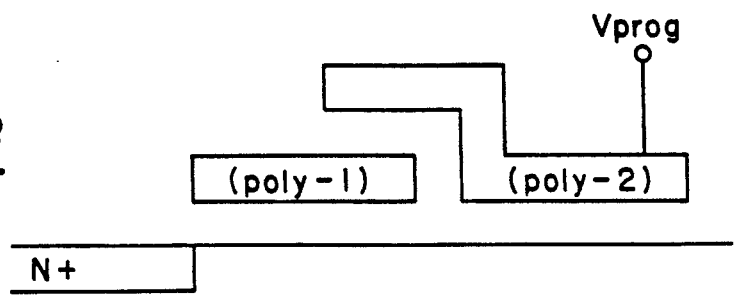
FIG. 5B is a cross-sectional view illustrating the embodiment of the circuit of FIG. 4.

However, in order to output the charged voltage $V_{REF}$, the capacitor must be fabricated so that the electron charge mass Q does not increase or decrease as a function of time. The preferred embodiment for effectuating the invention is shown in FIG. 5.

The capacitor structure shown in FIG. 5 is similar to the structure mainly used in an $E^2$ PROM fabricated on a P-type substrate.

The source and the drain are n+type. The capacitor is fabricated using a Double Poly MOS Process, by which said capacitor comprises a first poly layer, a second poly layer, and an isolating layer intervened therebetween.

The first poly layer is a floating gate, the second poly layer a controlling gate.

The floating gate and the controlling gate are overlapped and the floating gate is formed having a ziz-zag shape so as to decrease tunneling voltage effects by increasing the electric field between the overlapped gates. Tunneling voltage is further reduced by increasing the number of parallel floating gate regions in a ziz-zag. The electron charge mass charging a floating gate is regulated by an external voltage $V_{prog}$ applied to a controlling gate contact. The floating gate-source voltage $V_{fs}$ (not shown), at the beginning, is determined by the capacitance between the floating gate-controlling gate and the floating gate-substrate.

When the floating gate-controlling gate voltage is sufficient to generate a tunnel voltage effect, the voltage $V_{fs}$ increases exponentially.

Therefore, the electron change mass at the floating gate can be controlled by the magnitude of the applied voltage, the pulse width, and the number of the pulse. For a detailed discussion of the semiconductor physics principles inherent in the floating gate structure of FIGS. 5A and 5B, read "Hardware Annealing in Analog VLSI Neurocomputing" by Bang W. Lee et al, Kluwer Academic Publishers 1991, pp. 104–112; incorporated herein by reference.

As a result, because the electron charge mass at the floating gate does not change with time, this gate can be made to function a capacitor of the present invention. Furthermore, because the electron charge mass of the capacitor fabricated in the manner described above does not vary with to temperature, a reference voltage provided therefrom also does not change with temperature and the OP AMP input offset voltage will not effect output reference voltage $V_{REF}$. As a result, compared with conventional bandgap reference circuits, the influence of an input offset voltage of the OP AMP largely decreases and deterioration of the circuit overtime and changing temperature is prevented.

The preferred embodiments described above are illustrative and not restrictive. The scope of the invention being indicated by the appended claims and all variations which come within the meaning of the claims are intended to be embraced therein.

We claim:

1. A voltage regulator circuit comprising:

an operational amplifier including an inverting terminal, a non-inverting terminal, and an output terminal electrically connected to said inverting terminal; and a capacitor including a floating gate, a controlling gate, and an isolating layer, said capacitor being connected to the non-inverting terminal of said operational amplifier and having a programmed reference voltage charge stored therein, wherein said operational amplifier receives and outputs said reference voltage charge which is unaffected by changes in temperature.

2. A circuit as set forth in claim 1, wherein said programmed reference voltage charge stored in said capacitor is constant over increasing time.

3. A circuit as set forth in claim 2, wherein said capacitor is fabricated using a Double Poly MOS Process, said capacitor comprising a first poly layer, a second poly layer, and an isolating layer intervened therebetween.

4. A circuit as set forth in claim 3, wherein said first poly layer corresponds to said floating gate and said second poly layer corresponds to said controlling gate.

5. A circuit as set forth in claim 4, wherein a contact area between said floating gate and said controlling gate is formed having a plurality of bumps so as to decrease a tunneling voltage effect therebetween by increasing an electric field between said floating gate and said controlling gate.

* * * * *